(12) United States Patent
Sung

(10) Patent No.: US 8,798,970 B2
(45) Date of Patent: Aug. 5, 2014

(54) METHOD FOR OIL PREDICTION IN FRACTURED RESERVOIRS AND RECORDED MEDIUM THEREFOR

(71) Applicant: Industry-University Coorperation Foundation Hanyang University, Seoul (KR)

(72) Inventor: Won-Mo Sung, Seoul (KR)

(73) Assignee: Industry-University Cooperation Foundation Hanyang University, Seoul (KR)

(*) Notice: Subject to any disclaimer, the term of this patent is extended or adjusted under 35 U.S.C. 154(b) by 0 days.

(21) Appl. No.: 13/716,876

(22) Filed: Dec. 17, 2012

(65) Prior Publication Data

US 2013/0124169 A1    May 16, 2013

Related U.S. Application Data

(63) Continuation of application No. PCT/KR2011/004416, filed on Jun. 16, 2011.

(30) Foreign Application Priority Data

Jun. 18, 2010   (KR) .................. 10-2010-0058215

(51) Int. Cl.
*G06F 7/60*   (2006.01)
*G06F 17/10*   (2006.01)

(52) U.S. Cl.
USPC .................................. 703/2; 703/9; 703/10

(58) Field of Classification Search
USPC ........................................ 703/2, 9.1
See application file for complete search history.

(56) References Cited

U.S. PATENT DOCUMENTS

2002/0013687 A1*   1/2002   Ortoleva .................. 703/10

OTHER PUBLICATIONS

Lee, et al, "A Study on 3D DFN Model Using 2D Areal Survey and 1D FMI Well Logging", The Korean Society of Mineral and Energy Resources Engineers, vol. 46, No. 6, pp. 711-720, Nov. 2009.
Sung, et al., "The Numerical Modeling Study for the Simultaneous Flow of Leachate and LFG in Kimpo Landfill", Journal of the Korean Society of Groundwater Environment, vol. 6., No. 2., pp. 104-106, Jun. 1999.

* cited by examiner

*Primary Examiner* — Saif Alhija
(74) *Attorney, Agent, or Firm* — Edwards Wildman Palmer LLP

(57) ABSTRACT

The present invention relates to a method of predicting an amount of production from a fractured reservoir and a recorded medium for the method. The method of predicting an amount of production from a fractured reservoir can include: (a) generating a fracture network model, which includes discrete fractures, using fracture characteristic information; (b) generating a flow model for representing flow paths for a fluid between the discrete fractures using a 2-dimensional finite difference method; and (c) predicting the amount of production from the fractured reservoir using the flow model.

10 Claims, 9 Drawing Sheets

METHOD FOR OIL PREDICTION IN FRACTURED RESERVOIRS AND RECORDED MEDIUM THEREFOR

TECHNICAL FIELD

The present invention relates to a method of predicting an amount of production from a fractured reservoir and a recorded medium therefor, more particularly to a method and a recorded medium that can accurately represent flow within a fracture network and thereby accurately predict the amount of oil and gas production.

BACKGROUND ART

A naturally fractured reservoir is generally composed of rock masses and fractures. The rock masses occupy most of the volume of the fractured reservoir but have very low fluid permeability, while the fractures occupy a small volume but have very high fluid permeability.

As such, the amount of oil or gas production in a fractured reservoir depends greatly on the connectivity of the fractured reservoir.

Therefore, in order to predict the amount of production of a fractured reservoir, it is essential to accurately represent the fracture network.

Some well known examples of methods for representing the fractures of a fractured reservoir include the dual porosity model and the discrete fracture network (DFN) model.

The dual porosity model, illustrated in FIG. 1, considers fracture characteristics that cannot be identified with the continuum model. This model assumes that the sizes (several millimeters to several centimeters) of the fracture apertures and the distances between the fractures are constant, and that the fractures are distributed uniformly in each direction.

The dual porosity model applies the flow amount in the rock masses as a source to the flow amount in the fractures when predicting the amount of production, and has the advantage of allowing a convenient representation of multi-phase flow of oil-gas-water.

The discrete fracture network model is based on the assumption that, when there are numerous interconnected fractures within the bedrock, the flow depends mainly on the fractures having connections with one another, since the rock masses have low permeability. Unlike the dual porosity model, the discrete fracture network model assumes that each of the discrete fractures is distributed with its own characteristics for length, center, strike, slope, aperture, etc., as illustrated in FIG. 2.

The discrete fracture network model can accurately represent the complicated fracture network that exists in an actual fractured reservoir and can calculate the flow of fluids within a fracture network using intersections between the fractures.

With the dual porosity model according to the related art, however, the individual characteristics of the fractures are not considered, and the fracture network is overly simplified. This results in a simple, continuous fracture flow network that differs from the actual fractured reservoir, so that it is impossible to represent the actual flow tendencies of oil-gas-water within a stratum.

With the discrete fracture network model according to the related art, the 2-dimensional flow within a planar fracture is assumed as a 1-dimensional linear flow. Thus, there is the disadvantage that the flow of oil-gas-water cannot be accurately represented in a fracture having a very large thickness in the vertical direction (such as that in the Vietnam 15-1 oilfield, for example).

That is, a flow model according to the related art may assume a 2-dimensional flow as a 1-dimensional linear flow and may approximate discrete fractures as vertical fractures, so that the flow model can represent flow considering only the lengths of discrete fractures and cannot represent an actual flow according to the strike, slope, and width of the discrete fractures.

DISCLOSURE

Technical Problem

An aspect of the present invention, devised to resolve the problems above, is to propose a method, and a recorded medium for the method, that can accurately represent flow within a fracture network and thereby accurately predict the amount of production from a fractured reservoir.

Technical Solution

To achieve the objective above, an aspect of the present invention provides a method of predicting an amount of production from a fractured reservoir that includes: (a) generating a fracture network model, which includes discrete fractures, using fracture characteristic information; (b) generating a flow model for representing flow paths for a fluid between the discrete fractures using a 2-dimensional finite difference method; and (c) predicting the amount of production from the fractured reservoir using the flow model.

The fracture characteristic information can include at least one of a depth, a strike, a slope, a length, a width, and an aperture of the discrete fractures, and the fracture characteristic information can be computed by analyzing at least one of 2-dimensional seismic wave data, outcrop data, and borehole image data.

Generating the flow model can include: (b1) identifying intersecting discrete fractures, which intersect each other, from among the discrete fractures; (b2) transforming the intersecting discrete fractures into 2-dimensional finite difference method grid squares; and (b3) obtaining intersection block information relating to interconnected grid squares.

Transforming the intersecting discrete fractures into 2-dimensional finite difference method grid squares can include: computing an optimal number of grid squares for each of the intersecting discrete fractures in consideration of an average size of the intersecting discrete fractures; and determining the size of a grid square by using the computed optimal number of grid squares.

Predicting the amount of production from the fractured reservoir can include: (c1) calculating a flow conductance coefficient for each of the interconnected grid squares; and (c2) computing a pressure for each of the interconnected grid squares by using the calculated flow conductance coefficients.

The flow conductance coefficient can be calculated by using star-delta transformation on a preset characteristic value, and the characteristic value can include at least one of initialization information, reservoir/fluid characteristic information, and oil well configuration information.

Predicting the amount of production from the fractured reservoir can include establishing a matrix system of the calculated flow conductance coefficients in order to compute a solution to a non-linear flow partial differential equation incorporating all of a depth, a direction characteristic, and a size characteristic of the intersecting discrete fractures.

The direction characteristic can include a strike and a slope of each of the intersecting discrete fractures, and the size characteristic can include a length, a width, and an aperture of each of the intersecting discrete fractures.

A calculation process using the matrix system can be performed repeatedly until the computed pressure satisfies a preset error range.

Predicting the amount of production from the fractured reservoir can include calculating the degrees of saturation of oil, gas, and water in each of the grid squares by using the computed pressures, and the calculating of the degrees of saturation can be performed repeatedly up to a preset time point.

Another aspect of the present invention provides a recorded medium readable by a digital processing device, tangibly embodying a program of instructions executable by the digital processing device to perform a method for predicting an amount of production from a fractured reservoir, where the method includes: (a) generating a fracture network, which includes discrete fractures, using fracture characteristic information; (b) generating a flow model for representing flow paths for a fluid between the discrete fractures using a 2-dimensional finite difference method; and (c) predicting the amount of production from the fractured reservoir using the flow model.

Yet another aspect of the present invention provides a method of predicting an amount of production from a fractured reservoir that includes: identifying intersecting discrete fractures that intersect each other from among discrete fractures included in a fracture network; transforming the intersecting discrete fractures into 2-dimensional finite difference method grid squares; and obtaining intersection block information relating to interconnected grid squares, where a flow direction between the interconnected grid squares is determined by using the obtained intersection block information, and the amount of production from the fractured reservoir is predicted based on the determined flow direction.

Advantageous Effects

According to certain embodiments of the present invention, a 2-dimensional finite difference method is used for modeling the fluid flow within a fracture network, making it possible to reflect the actual flow within fractures and thus accurately predict the amount of production from a fractured reservoir.

MODE FOR INVENTION

Figure 1:
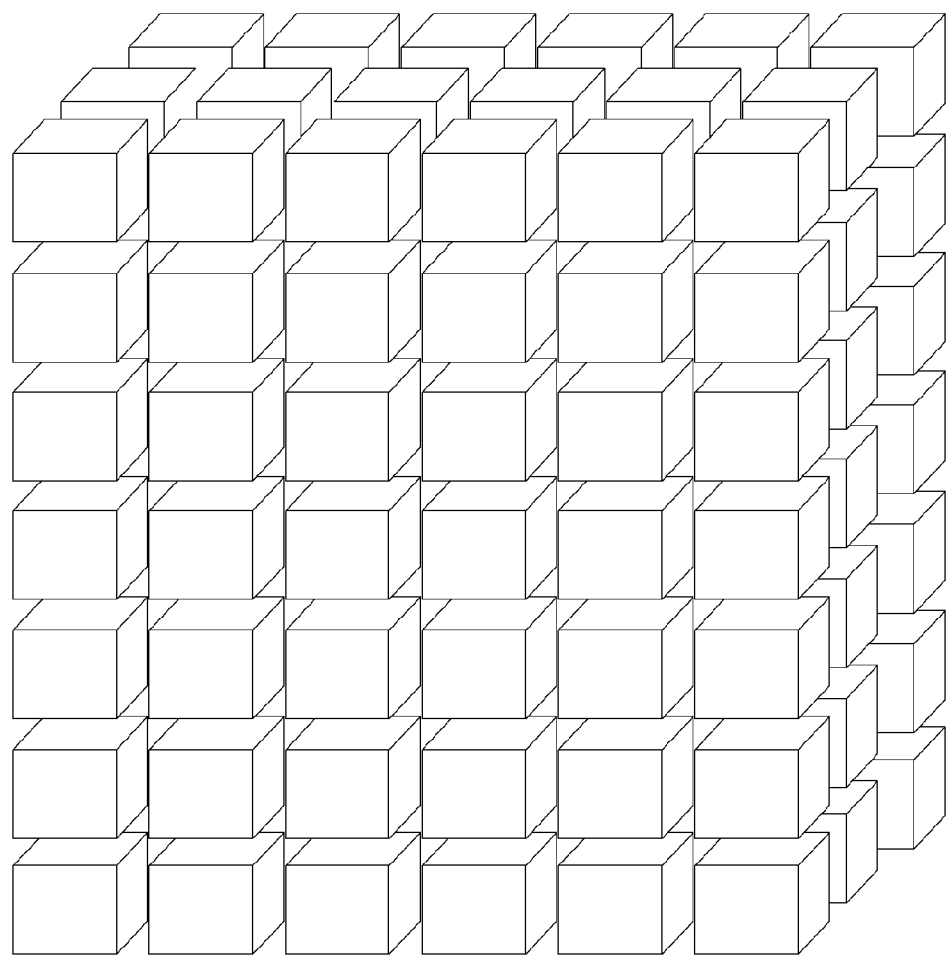
FIG. 1 illustrates a typical dual porosity model.
Figure 2:
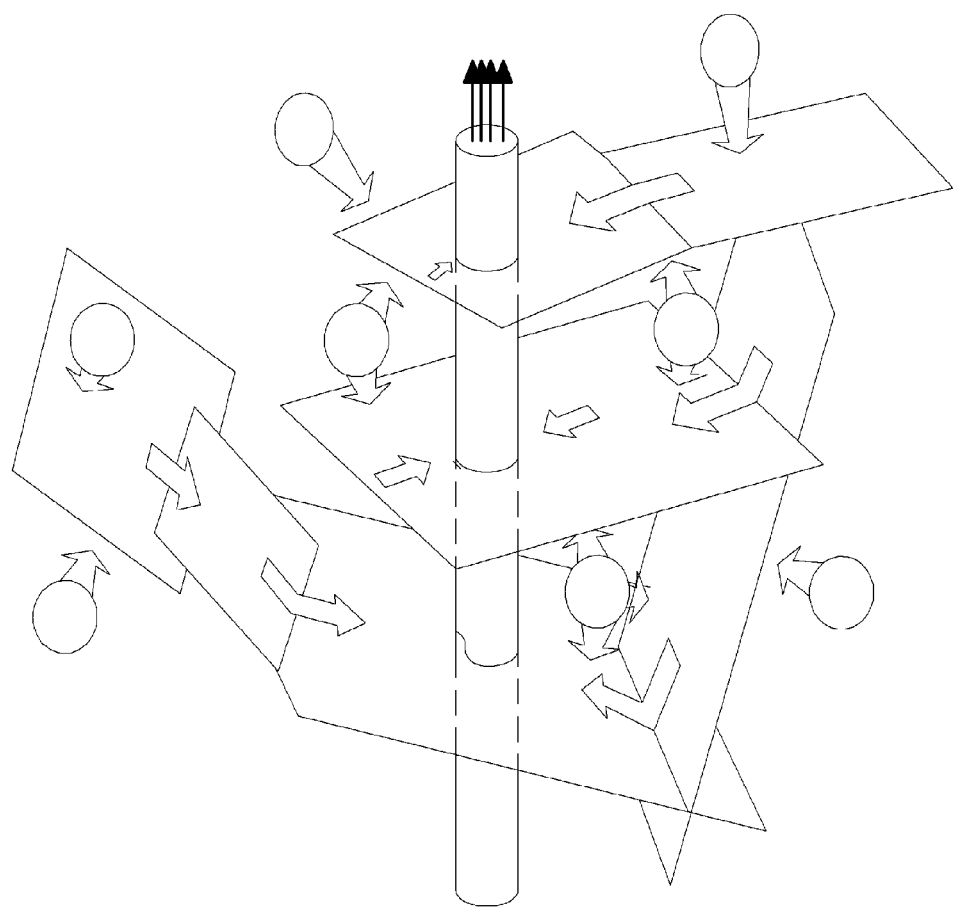
FIG. 2 illustrates a typical discrete fracture network model.
Figure 3:
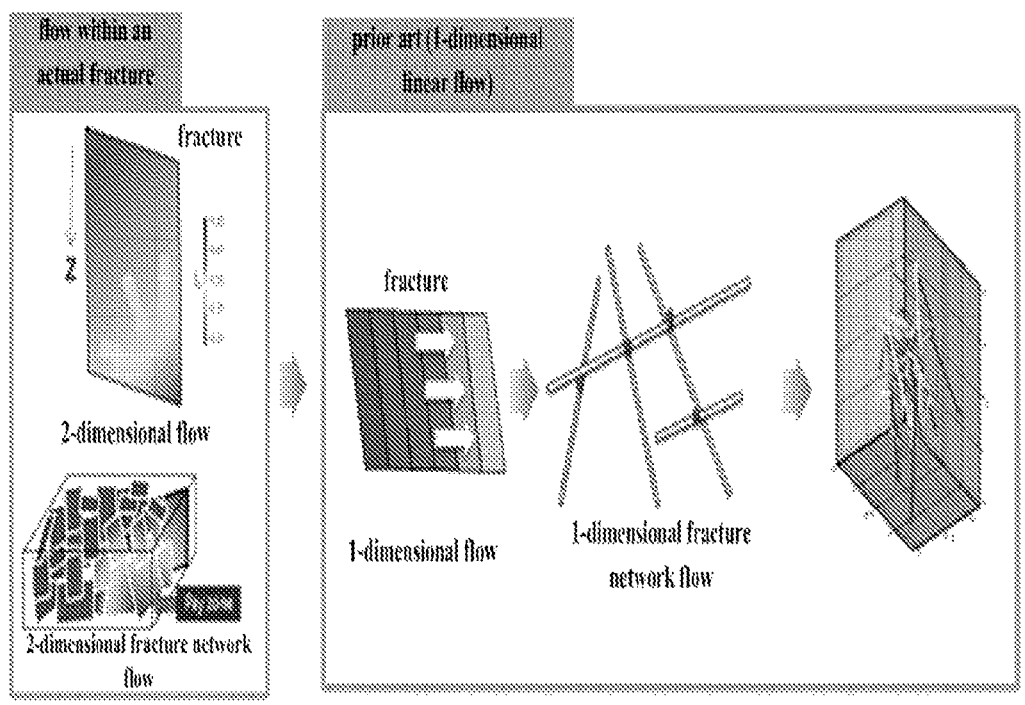
FIG. 3 illustrates a 1-dimensional linear flow model according to the related art.

Certain embodiments of the present invention will be described below in more detail with reference to accompanying drawings. For better understanding of the overall invention, the same reference numerals will be used for the same elements regardless of the figure number.

Figure 4:
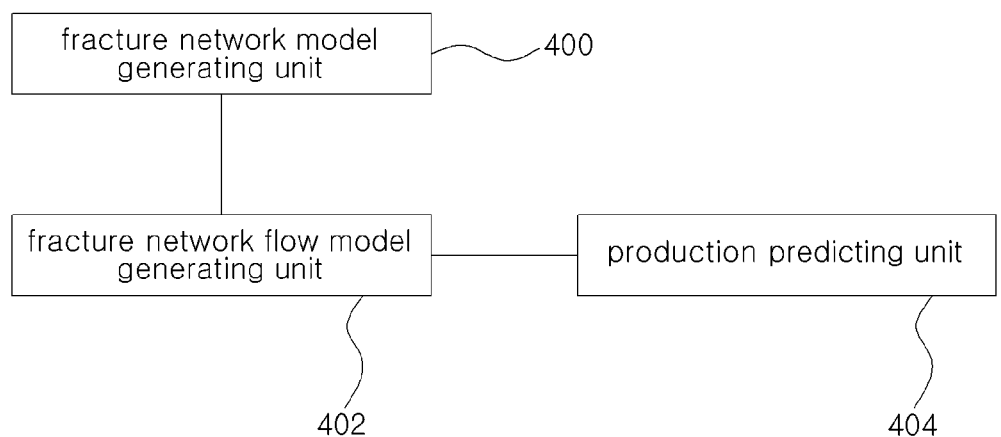
FIG. 4 is a block diagram of an apparatus for predicting production amount according to an embodiment of the present invention.

FIG. 4 is a block diagram of an apparatus for predicting the amount of production from a fractured reservoir according to an embodiment of the present invention.

The apparatus for predicting the amount of production from a fractured reservoir according to this embodiment can be a computer for performing certain calculation procedures.

As illustrated in FIG. 4, the apparatus for predicting the amount of production from a fractured reservoir according to this embodiment can include a fracture network model generating unit 400, a fracture network flow model generating unit 402, and a production predicting unit 404.

Figure 5:
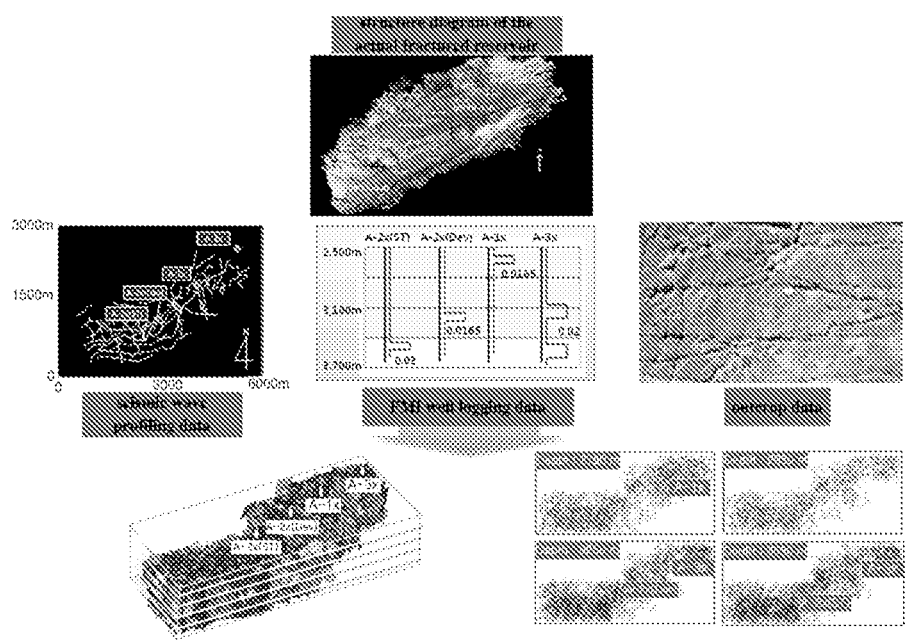
FIG. 5 illustrates a procedure for generating a fracture network model according to an embodiment of the present invention.

The fracture network model generating unit 400 may analyze 2-dimensional seismic wave data, borehole image data (FMI (Formation MicroImager) log), and outcrop data for a fractured reservoir, as illustrated in FIG. 5, and may compute fracture characteristic information based on such data.

The fracture characteristic information can include depth, center, direction characteristics (strike, slope), and size characteristics (length, width, aperture) of discrete fractures.

Here, the linear coordinates of the fractures can be obtained from the 2-dimensional seismic wave data, and the directionalities of discrete fractures can be determined based on the borehole image data.

The fracture network model generating unit 400 may generate a fracture network model for representing the fractured reservoir by applying the Monte Carlo method, which takes a statistical approach, and a weighted average method, which is to consider non-uniformity in the vertical/horizontal directions.

The fracture network flow model generating unit 402 may use the fracture network model generated as described above to generate a flow model for representing the flow paths of fluid between the discrete fractures.

Figure 6:
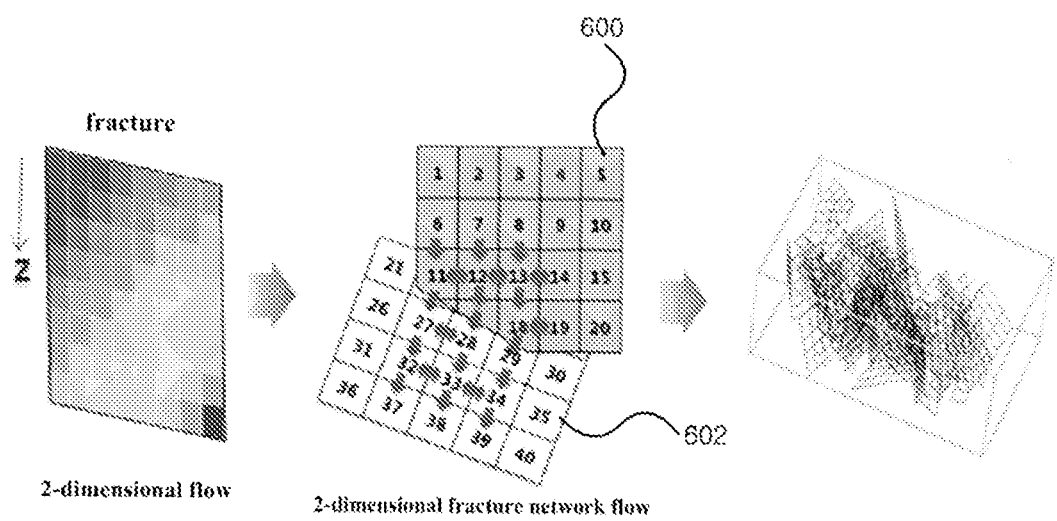
FIG. 6 illustrates a procedure for generating a fracture network flow model according to an embodiment of the present invention.

According to an embodiment of the present invention, the fracture network flow model generating unit 402 may generate a flow model for the fracture network using a 2-dimensional finite difference method (FDM), as illustrated in FIG. 6, in order to accurately represent the gravity-drainage flow of oil, gas, and water, particularly in a thick fracture.

The fracture network flow model generating unit 402 may assume the discrete fractures are quadrangular types and may consider direction characteristics and size characteristics in generating a model capable of representing flow in discrete fractures.

The fracture network flow model generating unit 402 may determine the intersections of all discrete fractures included in the fracture network and may identify discrete fractures that intersect (hereinafter referred to as "intersecting discrete fractures"), removing non-intersecting fractures.

Here, a reason for removing the non-intersecting fractures is because it is assumed that the fluid can flow only through fractures within the fractured reservoir.

The fracture network flow model generating unit 402 may determine the intersections of the discrete fractures in consideration of the number of discrete fractures and the lengths of the discrete fractures.

An ID may be conferred on each of the intersecting discrete fractures, and the fracture network flow model generating unit 402 according to this embodiment may transform the intersecting discrete fractures into 2-dimensional finite difference method (FDM) grid squares.

In transforming to 2-dimensional FDM grid squares, the fracture network flow model generating unit 402 may compute the optimal number of grid squares for the discrete fractures in consideration of the average size (area) of the discrete fractures, in order that there may be 1:1 correspondence between intersecting grid squares. Also, the size of the grid squares may be determined by using the computed optimal number of grid squares.

The fracture network flow model generating unit 402 may check the connections between grid squares included in the intersecting discrete fractures to obtain intersection block information.

Here, the intersection block information refers to interconnected grid squares from among the grid squares included in the intersecting discrete fractures. Grid square IDs are conferred on grid squares included in the intersection block information, for use in finding a solution of a non-linear flow partial differential equation described later.

The production predicting unit 404 may perform a process for predicting the amount of production from the fractured reservoir, using the fracture network model and the fracture network flow model generated as above, as well as other preset characteristic values.

The production predicting unit 404 may determine the flow directions between the interconnected grid squares. Here, determining the flow directions may involve calculating the flow conductance coefficient of each grid square.

Referring to FIG. 6, in computing the flow conductance coefficients, the interconnected grid squares may be identified for a first discrete fracture 600 and a second discrete fracture 602 intersecting each other, and the flow conductance coefficients may be computed in consideration of the connections of the grid squares.

For example, looking at grid square no. 12 of the first discrete fracture 600, grid square no. 12 is connected to grid squares nos. 7, 11, and 13 in the first discrete fracture 600 it is located in, but is also connected to grid square no. 28 of the second discrete fracture 602. The production predicting unit 404 may calculate the flow conductance coefficient for each interconnected grid square, in consideration of the connections between grid squares.

Also, in computing the flow conductance coefficient for each grid square, the production predicting unit 404 may use the characteristic values mentioned above and may employ a star-delta transformation method.

Here, the characteristic values can include initialization information, reservoir/fluid characteristic information, and oil well configuration information.

The initialization information can include initial pressure due to density differences at the GOC (gas-oil contact) and OWC (oil-water contact) depth levels, and can also include information on the degree of oil saturation in the upper layer and the degree of water saturation in the lower layer at the OWC level, and the degree of gas saturation in the upper layer and the degree of oil saturation in the lower layer at the GOC level.

The reservoir/fluid characteristic information can include relative permeability values, density values of the oil/gas/water, formation volume factors, viscosity values, and dissolved GOR (gas oil ratio) values, computed using the degrees of fluid saturation for oil, gas, and water described above.

The densities, formation volume factors, viscosities, and dissolved GORs above can be computed using pressure and temperature values from Ahmed equations, Beggs-Robinson & Khan equations, etc.

The oil well configuration information can include operating conditions for constant production (for one selected from oil, gas, oil/water, oil/gas/water) and operating conditions for constant oil well pressure.

The production predicting unit 404 may compute the pressure for each of the interconnected grid squares, by using the flow conductance coefficients calculated using the characteristic values above.

Computing the pressures for the grid squares can involve finding the solution for a non-linear partial differential equation such as Equation 1 below.

$$V_b \frac{\partial}{\partial t}\left(\frac{S}{B}\right) - \frac{\partial}{\partial x}\left[\left\{\frac{(\Delta x \times w \times b) \times b^2}{12} \frac{k_r}{\mu B}\right\}\left\{\frac{\partial}{\partial x}\left(P - \rho\frac{g}{g_c}D\right)\right\}\right] -$$
$$\frac{\partial}{\partial y}\left[\left\{\frac{(\Delta y \times w \times b) \times b^2}{12} \frac{k_r}{\mu B}\right\}\left\{\frac{\partial}{\partial y}\left(P - \rho\frac{g}{g_c}D\right)\right\}\right] +$$
$$\tau - q_{well}\delta = 0$$
$$\tau_o = \sigma\frac{k_m k_{ro}}{\mu}\left\{[p_f - p_m] - \left(\frac{\sigma_z}{\sigma}\right)\gamma_o(D_f - D_m)\right\}$$
$$\sigma = \frac{4n(n+2)}{l^2}: shapefactor$$

$l$: surface-volume ratio of a matrix block $n$: normal sets of fractures

[Equation 1]

$V_b$ refers to bulk volume (grid square volume), t is time, S is oil saturation, B is formation volume factor (bbl/STB), $\Delta x$ is the length of a discrete fracture in the x direction, $\Delta y$ is the length of a discrete fracture in the y direction, w is width, b is aperture, $k_r$ is relative permeability, $\mu$ is viscosity, P is pressure, $\rho$ is density, g is gravitational acceleration, $g_c$ is a constant, D is depth, and q is oil production/injection rate (amount of production).

An embodiment of the present invention, by calculating the pressure of each grid square using a non-linear flow partial differential equation such as Equation 1, can represent flow considering the directional characteristics and size characteristics of discrete fractures within the fracture network.

To find the solution of the non-linear flow partial differential equation, the production predicting unit 404 may arrange the flow conductance coefficient of each grid square into a Jacobian matrix system, and then repeat the calculations for the matrix system until the computed pressure for each grid square satisfies the error range, at which point the pressure is determined to be the pressure for the respective grid square.

According to an embodiment of the present invention, the matrix calculation can be performed by applying a Sparse Matrix Solver model, to check the residual for the calculated pressure and decide whether or not the calculated pressure exists within the preset error range, and repeat the calculation process above until the result approaches the error range.

When the pressure for each grid square exists within the error range, the production predicting unit 404 may calculate the degrees of saturation for oil, gas, and water.

Here, the calculation of the degrees of saturation for oil and water can be performed by using MBEs (material balance equations) for the grid squares within a fracture according to an explicit method, and the calculation of the degree of gas saturation can be performed by way of fluid saturation equilibrium relationships.

As the calculations for the pressures of the grid squares and calculations for the degrees of saturation are repeated to a certain time point, it is possible to predict the amount of production from the fractured reservoir according to time.

Figure 7:
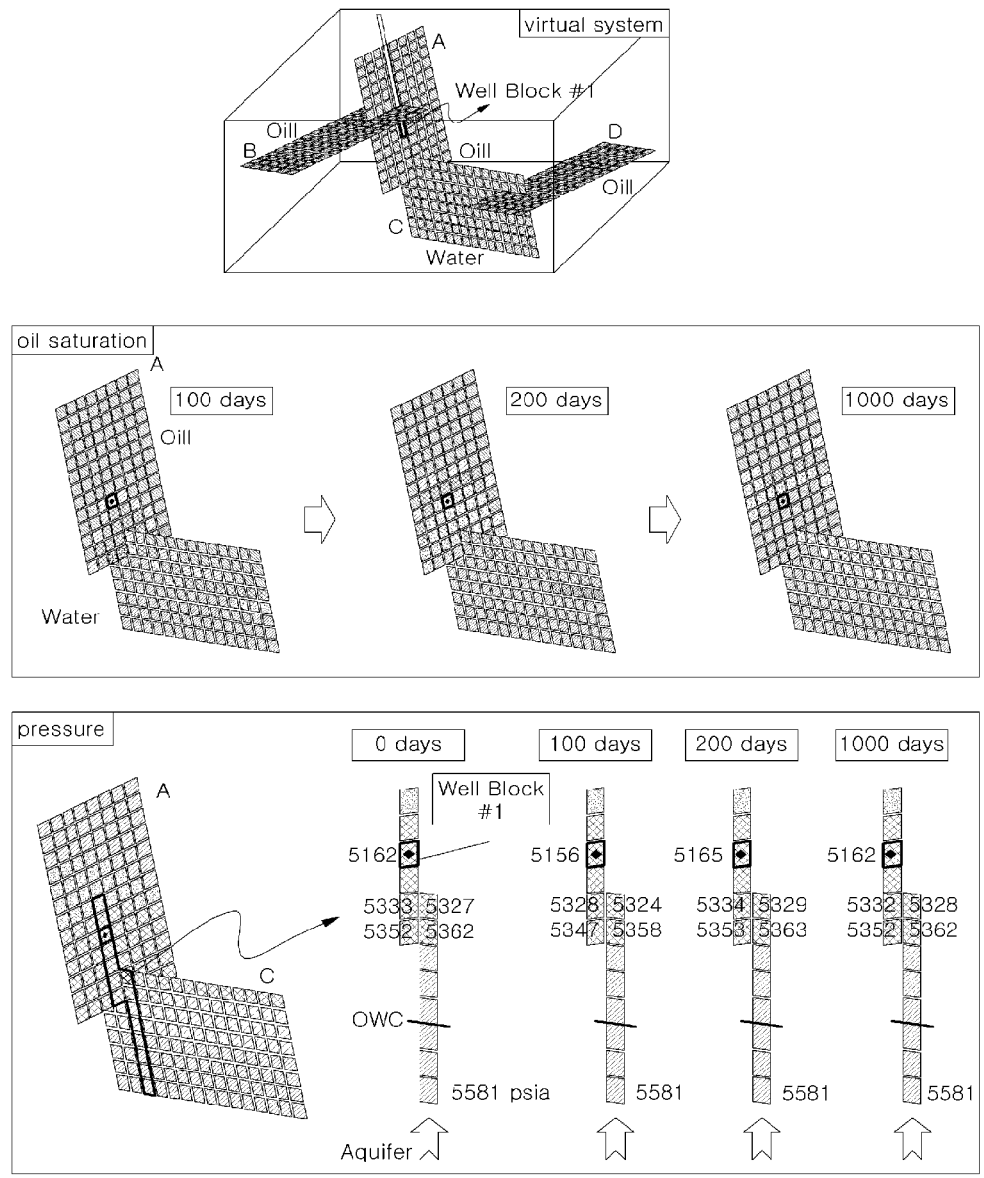
FIG. 7 illustrates the modeling results for a fracture network according to an embodiment of the present invention.

FIG. 7 illustrates the modeling results for a fracture network according to an embodiment of the present invention, where FIG. 7 shows a virtual fractured reservoir system, changes in the degree of oil saturation according to time, and changes in pressure according to time.

As illustrated in FIG. 7, when the amount of production is predicted by assuming 2-dimensional fracture network flow, the fluid movement can be more accurately represented compared to the existing 1-dimensional linear flow, especially for thick fractures, and thus it is possible to accurately predict the amount of production.

Figure 8:
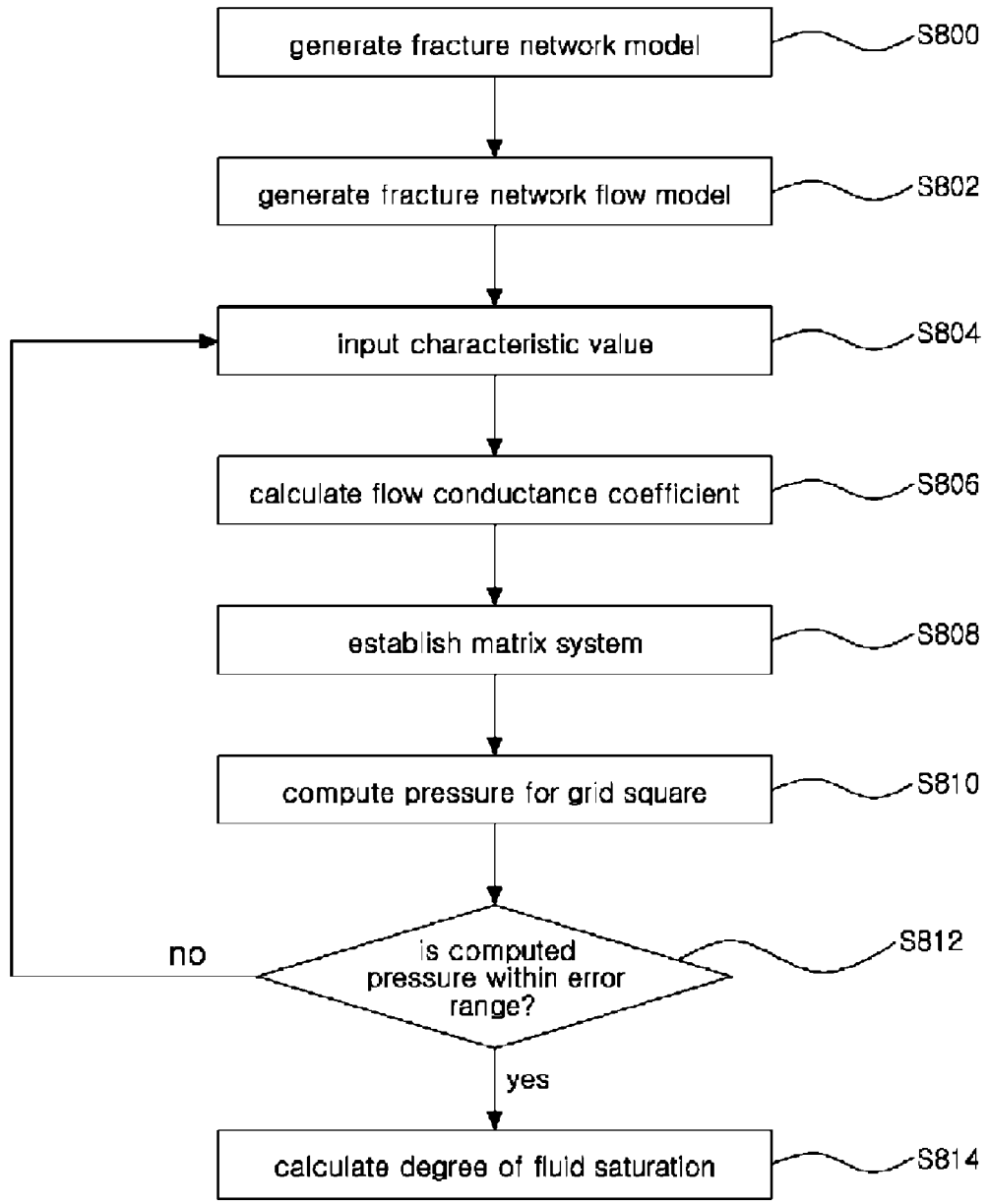
FIG. 8 is a flowchart illustrating a procedure for predicting the amount of production from a fractured reservoir according to an embodiment of the present invention.

FIG. 8 is a flowchart illustrating a procedure for predicting the amount of production from a fractured reservoir according to an embodiment of the present invention.

Referring to FIG. 8, an apparatus for predicting the production amount from a fractured reservoir according to an embodiment of the present invention may generate a fracture network model by using fracture characteristic information such as the length, width, aperture, etc., of discrete fractures (step 800).

Afterwards, a fracture network flow model may be generated using the fracture network model generated in step 800 and a 2-dimensional finite difference method (step 802).

Step 802 may involve transforming discrete fractures that intersect each other (intersecting discrete fractures) into 2-dimensional finite difference method grid squares and obtaining intersection block information. This will be described later in further detail with reference to FIG. 9.

When a fracture network flow model using a 2-dimensional finite difference method is generated, the characteristic values may be inputted (step 804), the flow conductance coefficient may be calculated for each of the interconnected grid squares (step 806), and a Jacobian matrix system may be established that includes the calculated flow conductance coefficients (step 808).

Using the Jacobian matrix system, the pressure for each grid square may be computed (step 810).

Afterwards, it may be decided, by way of a convergence check, whether or not the calculated pressures lie within the error range (step 812), and if they do not, steps 804 to 810 described above may be repeated.

If the calculated pressures for the grid squares are within the error range, a process may be performed for calculating the degree of fluid saturation (step 814).

While the above description is set forth for an example in which the process for inputting the characteristic values, etc., is performed after the 2-dimensional flow model is generated, steps 802 and 804 can also be performed in a different sequence.

Figure 9:
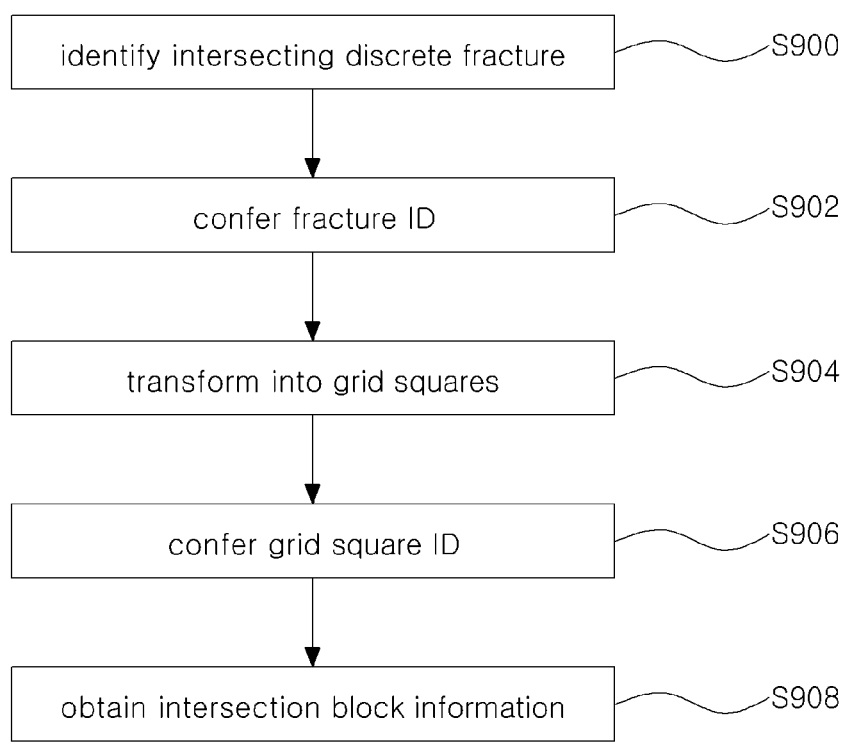
FIG. 9 is a flowchart illustrating a procedure for generating a fracture network flow model according to an embodiment of the present invention.

FIG. 9 is a flowchart illustrating a procedure for generating a 2-dimensional flow model in more detail. Referring to FIG. 9, intersecting discrete fractures may be identified (step 900), which are discrete fractures that intersect one another from among the discrete fractures included in the fracture network generated in step 800 above.

Afterwards, unique IDs (fracture IDs) may be conferred on the intersecting discrete fractures in a particular order (step 902).

Next, for the intersecting discrete fractures, each fracture may be transformed into a 2-dimensional finite difference method grid square (step 904).

As described above, step 904 may involve a process for determining the size of the grid squares in consideration of the average size of the discrete fractures.

Unique IDs may be conferred on the transformed grid squares (step 906).

Afterwards, intersection block information relating to the interconnected grid squares may be obtained by checking the connections of the grid squares (step 908).

By solving a partial differential equation such as Equation 1 as described above using property values (e.g. flow conductance coefficients, etc.) for intersecting discrete fractures and grid squares having unique IDs and using a Jacobian matrix system, it is possible to calculate the pressure for each grid square within a 2-dimensional quadrilateral fracture, which in turn enables an accurate prediction of the amount of production.

The embodiments of the present invention can be implemented in the form of program instructions that may be performed using various computer means and can be recorded in a computer-readable medium. Such a computer-readable medium can include program instructions, data files, data structures, etc., alone or in combination. The program instructions recorded on the medium can be designed and configured specifically for the present invention or can be a type of medium known to and used by the skilled person in the field of computer software. Examples of a computer-readable medium may include magnetic media such as hard disks, floppy disks, magnetic tapes, etc., optical media such as CD-ROM's, DVD's, etc., magneto-optical media such as floptical disks, etc., and hardware devices such as ROM, RAM, flash memory, etc. Examples of the program of instructions may include not only machine language codes produced by a compiler but also high-level language codes that can be executed by a computer through the use of an interpreter, etc. The hardware mentioned above can be made to operate as one or more software modules that perform the actions of the embodiments of the invention, and vice versa.

The embodiments of the present invention described in the above are for illustrative purposes only. It is to be appreciated that those of ordinary skill in the art can modify, alter, and make additions to the embodiments without departing from the spirit and scope of the present invention, and that such modification, alterations, and additions are encompassed in the appended claims.

The invention claimed is:

1. A method of predicting an amount of production from a fractured reservoir performed by a computer for predicting the amount of production from the fractured reservoir, the computer including a memory containing instructions adapted to cause the computer to operate as a fracture network model generating unit, a fracture network flow model generating unit and a production predicting unit, the method comprising:

(a) generating, by the computer, a fracture network model using fracture characteristic information, by the fracture network model generating unit, the fracture network model including discrete fractures;

(b) generating, by the computer, a flow model for representing flow paths for a fluid between the discrete fractures using a 2-dimensional finite difference method by the fracture network flow model generating unit; and (c) predicting, by the computer, the amount of production from the fractured reservoir using the flow model by the production predicting unit, wherein the generating of the flow model comprises, (b1) identifying intersecting discrete fractures intersecting each other from among the discrete fractures; (b2) transforming the intersecting discrete fractures into 2-dimensional finite difference method grid squares; and (b3) obtaining intersection block information relating to interconnected grid squares, and wherein the transforming comprises, computing an optimal number of grid squares for each of the intersecting discrete fractures in consideration of an average size of the intersecting discrete fractures; and determining a size of a grid square by using the computed optimal number of grid squares.

2. The method of claim 1, wherein the fracture characteristic information comprises at least one of a depth, a strike, a slope, a length, a width, and an aperture of the discrete fractures, and the fracture characteristic information is computed by analyzing at least one of 2-dimensional seismic wave data, outcrop data, and borehole image data.

3. The method of claim 1, wherein the predicting comprises:
(c1) calculating a flow conductance coefficient for each of the interconnected grid squares; and
(c2) computing a pressure for each of the interconnected grid squares by using the calculated flow conductance coefficients.

4. The method of claim 3, wherein the flow conductance coefficient is calculated by using star-delta transformation on a preset characteristic value, and the characteristic value includes at least one of initialization information, reservoir/fluid characteristic information, and oil well configuration information.

5. The method of claim 3, wherein the predicting comprises:
establishing a matrix system of the calculated flow conductance coefficients in order to compute a solution to a non-linear flow partial differential equation incorporating all of a depth, a direction characteristic, and a size characteristic of the intersecting discrete fractures.

6. The method of claim 5, wherein the direction characteristic comprises a strike and a slope of each of the intersecting discrete fractures, and the size characteristic comprises a length, a width, and an aperture of each of the intersecting discrete fractures.

7. The method of claim 5, wherein a calculation process using the matrix system is repeated until the computed pressure satisfies a preset error range.

8. The method of claim 3, wherein the predicting comprises:
calculating degrees of saturation of oil, gas, and water in each of the grid squares by using the computed pressures, and
the calculating of the degrees of saturation is repeated up to a preset time point.

9. A computer-readable non-transitory storage media readable by a digital processing device, tangibly embodying a program of instructions executable by the digital processing device to perform a method for predicting an amount of production from a fractured reservoir, the method comprising:

(a) generating a fracture network using fracture characteristic information, the fracture network model including discrete fractures;
(b) generating a flow model for representing flow paths for a fluid between the discrete fractures using a 2-dimensional finite difference method; and
(c) predicting the amount of production from the fractured reservoir using the flow model, wherein the generating of the flow model comprises, identifying intersecting discrete fractures intersecting each other from among the discrete fractures; transforming the intersecting discrete fractures into 2-dimensional finite difference method grid squares; and obtaining intersection block information relating to interconnected grid squares, and wherein the transforming comprises, computing an optimal number of grid squares for each of the intersecting discrete fractures in consideration of an average size of the intersecting discrete fractures; and determining a size of a grid square by using the computed optimal number of grid squares.

10. A method of predicting an amount of production from a fractured reservoir, performed by a computer for predicting the amount of production from the fractured reservoir, the computer including a memory containing instructions adapted to cause the computer to operate as a fracture network flow model generating unit, the method comprising:

identifying, by the computer, intersecting discrete fractures intersecting each other from among discrete fractures included in a fracture network by the fracture network flow model generating unit;

transforming, by the computer, the intersecting discrete fractures into 2-dimensional finite difference method grid squares by the fracture network flow model generating unit; and obtaining, by the computer, intersection block information relating to interconnected grid squares by the fracture network flow model generating unit, wherein a flow direction between the interconnected grid squares is determined by using the obtained intersection block information, and the amount of production from the fractured reservoir is predicted based on the determined flow direction, and wherein the transforming comprises, computing an optimal number of grid squares for each of the intersecting discrete fractures in consideration of an average size of the intersecting discrete fractures; and determining a size of a grid square by using the computed optimal number of grid squares.

* * * * *

UNITED STATES PATENT AND TRADEMARK OFFICE
CERTIFICATE OF CORRECTION

| | | |
|---|---|---|
| PATENT NO. | : 8,798,970 B2 | Page 1 of 1 |
| APPLICATION NO. | : 13/716876 | |
| DATED | : August 5, 2014 | |
| INVENTOR(S) | : Won-Mo Sung et al. | |

It is certified that error appears in the above-identified patent and that said Letters Patent is hereby corrected as shown below:

TITLE PAGE: ITEM 75 should read

Won-Mo Sung, Seoul (KR); Tae-Hun Lee, Seoul (KR)

Signed and Sealed this
Fourteenth Day of April, 2015

Michelle K. Lee
*Director of the United States Patent and Trademark Office*